United States Patent [19]
Yada

[11] Patent Number: 5,418,728
[45] Date of Patent: May 23, 1995

[54] COMPUTER AIDED DESIGN SUPPORT DEVICE

[75] Inventor: Hideaki Yada, Kawasaki, Japan

[73] Assignee: Fujitsu Limited, Kawasaki, Japan

[21] Appl. No.: 186,851

[22] Filed: Jan. 27, 1994

[30] Foreign Application Priority Data

Sep. 20, 1993 [JP] Japan ................... 5-257586

[51] Int. Cl.⁶ .............................................. G06F 15/46
[52] U.S. Cl. ................. 364/468; 364/474.24;
364/DIG. 1; 364/283.4; 364/DIG. 2;
364/974.4; 395/600
[58] Field of Search ............... 364/468, 478, 401, 402,
364/403, 474.24, 131–134, DIG. 1, DIG. 2;
395/919, 600

[56] References Cited

U.S. PATENT DOCUMENTS

| | | | |
|---|---|---|---|
| 5,089,970 | 2/1992 | Lee et al. | 364/468 |
| 5,150,288 | 9/1992 | Imai et al. | 364/468 X |
| 5,231,585 | 7/1993 | Kobayashi et al. | 364/468 |
| 5,287,284 | 2/1994 | Sugino et al. | 364/468 |

FOREIGN PATENT DOCUMENTS 2-48774 2/1990 Japan .

Primary Examiner—Joseph Ruggiero
Attorney, Agent, or Firm—Staas & Halsey

[57] ABSTRACT

A support device for a computer aided design system to improve efficiency in design work by achieving automatic recognition of associated design programs and automatic data transfer between the steps of a process of design, comprises a first, a second and a third design applications to be executed independently, a first, a second and a third design data bases to be called out by the design applications, and a management part connected to the data bases for managing the entire process. A design structure management file of the management part manages a hierarchical structure of the objects of design and when a modification of contents of design is made to one of the applications specifies a part or parts to which the modification is to be reflected. An identification file of the management part decides a direction of data transfer between the applications.

7 Claims, 20 Drawing Sheets

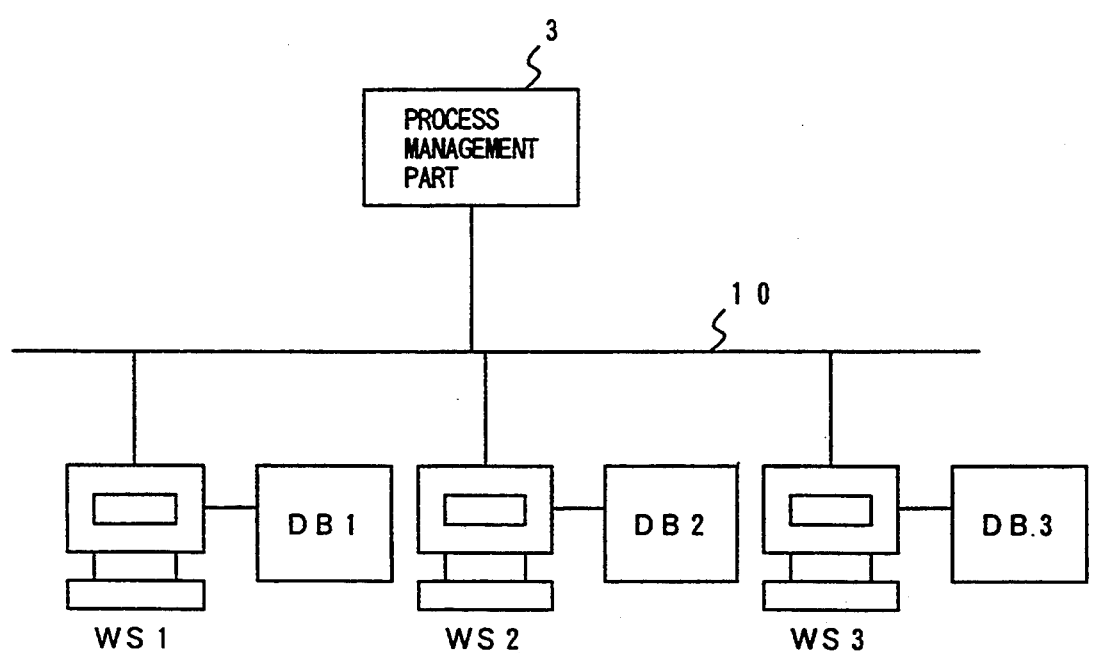
F I G. 4 deleting parts corresponding to symbols shown in circuit diagram

COMPUTER AIDED DESIGN SUPPORT DEVICE

BACKGROUND OF THE INVENTION (1) Field of the Invention

The present invention relates to a technology of computer aided design (CAD) for improving efficiency in a design work, and in particular, relates to a design support device for CAD to realize automatic recognition of associated design programs and automatic data transfer between the steps of a process of design.

(2) Description of the Related Art

In general, a process of designing electronic circuits may comprise three main steps of (1) circuit design, (2) simulation, and (3) packaging design.

In the "circuit design" step, conceptual circuit diagrams are drawn for each module which individually performs its function respectively, and connections of these modules are defined. In the "simulation" step, input/output signals to and from the modules are defined by describing in the form of timing charts.

In the "packaging design" step, physical elements such as logic ICs, memories etc. are arranged on a real print circuit board in accordance with the definitions which are made in the previous circuit design and simulation steps. Thus these steps are independent with each other such that the simulation step is carried out after completion of the circuit design step, and the packaging step is carried out lastly. Therefore, it takes a total number of hours of these three steps to design an electronic circuit.

In addition, the result of a preceding step (e.g. the circuit design step) is reflected to the succeeding step (e.g. the simulation step), so that the succeeding step can be started only after completion of the preceding step.

In this regard, the Japanese patent application laying open publication No. 2-48774 discloses a technology for control of version numbers of design data and hierarchical control for a CAD system. More particularly, according to this Japanese publication, when more than one designer are expected to make modifications to data of the same parts, any modification to the data made by one of the designers is immediately reflected to the data of the other designers, thus enabling simultaneous modification of the same design data to increase efficiency in the design work.

However, while this prior art is aimed as its principal object to unify data control, it is limited only to the same design step. For example, the unified data control can be applied only to the works in the circuit design step or in the packaging design step. To the contrary, the present invention is directed to unify data control through the entire design process in which a series of design works, for example, circuit design step—simulation step—packaging design step, are carried out step by step while keeping a certain time difference between the steps, but the Japanese publication is not intended to realize such unification of data control.

Referring to FIGS. 18 to 20, more details of such unified data control between the design steps will be described below.

FIG. 18 shows that a modification to hit symbols in the circuit design step may have an effect on a modification to elements in the packaging design step. This figure illustrates an example in which modification to the functions of a symbol in the circuit design step (left-hand side of the drawing) causes modification to the element in the packaging design step (right-hand side of the drawing). In order to put such modification under a unified control, it is necessary to accurately post the elements or parts corresponding to the symbols in a circuit diagram from the circuit design step to the packaging design step.

FIG. 19 shows another example in which modification to the inputs of particular external signals in the circuit design step (left side of the drawing) affects the timing charts in the simulation step (right side of the drawing). In order to unify the data control between these steps, it is necessary to accurately post the name of a signal corresponding to the external terminal I1 from the circuit design step to the simulation step.

FIG. 20 shows an example in which deletion of a particular symbol as shown in dotted line in the circuit design step (left-hand side of the drawing) is reflected to deletion of one of the parts in dotted line in the packaging design step. In this case, it is also necessary to accurately post name of the parts corresponding to the symbol from the circuit design step to the packaging design step.

The above mentioned Japanese publication did not take into consideration such unified data control between the design steps being carried out step by step. Also the invention of the publication is based on the assumption that a plural designers work under a single information processing system, and it does not give thought to what a CAD system should be in the future under the circumstances that, for example, a circuit designer, a simulation operator and a packaging designer work at each work station separately at remote locations.

In order to dissolve the above mentioned problems of the prior art, the present invention is directed to increase efficiency in the entire process of design in a computer aided design system.

SUMMARY OF THE INVENTION

The present invention comprises, as shown in FIG. 1 of the attached drawings, first, second and third design execution elements 1a, 1b, 1c, first, second and third data bases 2a, 2b and 2c which are called by each respective design execution elements 1a, 1b, 1c, and a process management part 3 of design structure control file 4 resides in the process management part 3 to manage a hierarchical structure and version numbers of objects of design, so that when any modification of the contents of design is made to the objects of design at one of the design execution elements, a part or parts of the object of design at the other design execution elements to which said modification is to be reflected can be specified. In the process management part also resides an execution elements identification file 5 to specify a direction of data transfer among the design execution elements.

The first, second and third design execution elements of the present invention mean, for example, a "circuit design application", a "simulation application" and a "packaging design application", respectively, which are, for example, activated on work-stations being connected to each other through a network.

According to the present invention, the design structure management file 4 manages the hierarchical structure and version numbers of the objects of design. Therefore, for example, if a lower module makes a change, a higher module which includes the lower module can be specified and this can be immediately reflected to the other design execution elements or the applications 1a, 1b, 1c.

This makes it possible to perform the circuit design, simulation and packaging design steps in parallel, while previously these steps were processed separately in such a way as batch processing. More precisely, the succeeding simulation step can be started during the circuit design step in process and when it has progressed to a certain point. Even if a change is made at the last stage of the circuit design step to the module due to, for example, fixing the bug, it can be immediately reflected to the simulation step which is already in process.

FIG. 2 schematically illustrates how the design process is reduced according to the present invention. As shown clearly in this figure, the present invention makes it possible to reduce the total design period by the period for the parallel processing i.e. "alpha" hours.

In addition to the system as shown in FIG. 1, the present invention can also advantageously be applied in particular to a system, as shown in FIG. 3, in which a workstation WS1 for performing circuit design, a workstation WS2 for simulation and a workstation WS3 for packaging design are connected to a LAN (Local Area Network), and a circuit design data base DB1, a simulation data base DB2 and a packaging data base DB3 are under the control of the process management part 3, in short, to a system in which distributed processing is performed by means of a communication system.

In this case, for each data base, processing device 6 (application processing means APM 1-3) is provided in order to achieve data processing of the data bases respectively, and data transfer between these execution and processing device 6 (the application processing means APM1-3) and the workstations WS1-3 may be established by means of inter-process communication such as socket communication which is now available by UNIX. Then, if a modification is made to one of the data base DB1-3, the modification can be posted by the processing device 6 (the application processing means APM1-3) to one or more of the workstations WS1-3 where associated process of design is just being carried out. In this regard, one of the characteristic features of the present invention is the fact that, for example, the application processing means APM1 which belongs to the workstation WS1 is allowed to communicate with, in addition to the workstation WS1, another workstation WS2 which is to execute the next step of the design process, As shown in FIG. 4, the data bases DB1-3 may be put under control of the workstations WS1-3 respectively. Here, programs being executed at each workstation WS1-3 act as the processing device 6 i.e. the application processing means APM1-3. For example, if a modification is made to the data base DB1 which is under control of the workstation WS1, the program which belongs to the workstation WS1 is able to post the modification to the other workstations, for example WS2, where associated design process is just in progress.

Thus, according to the present invention, if a change is made to one of the design execution elements during the operation thereof and the change may affect the succeeding design execution elements, the contents of the change can be immediately posted to the succeeding design execution elements to update the linked data base. This makes it possible to run a plural design execution elements in parallel without causing any inconsistencies, while the plural elements being expected to be executed step by step keeping a certain time difference therebetween. Therefore, the entire design process can be reduced to improve efficiency in a computer aided design system.

BRIEF DESCRIPTION OF THE DRAWINGS

The present invention will be described further, by way of examples, with reference to the accompanying drawing, in which:

FIG. 4 is a block diagram of another modification of the invention;

DETAILED DESCRIPTION OF THE EMBODIMENTS

Figure 1:
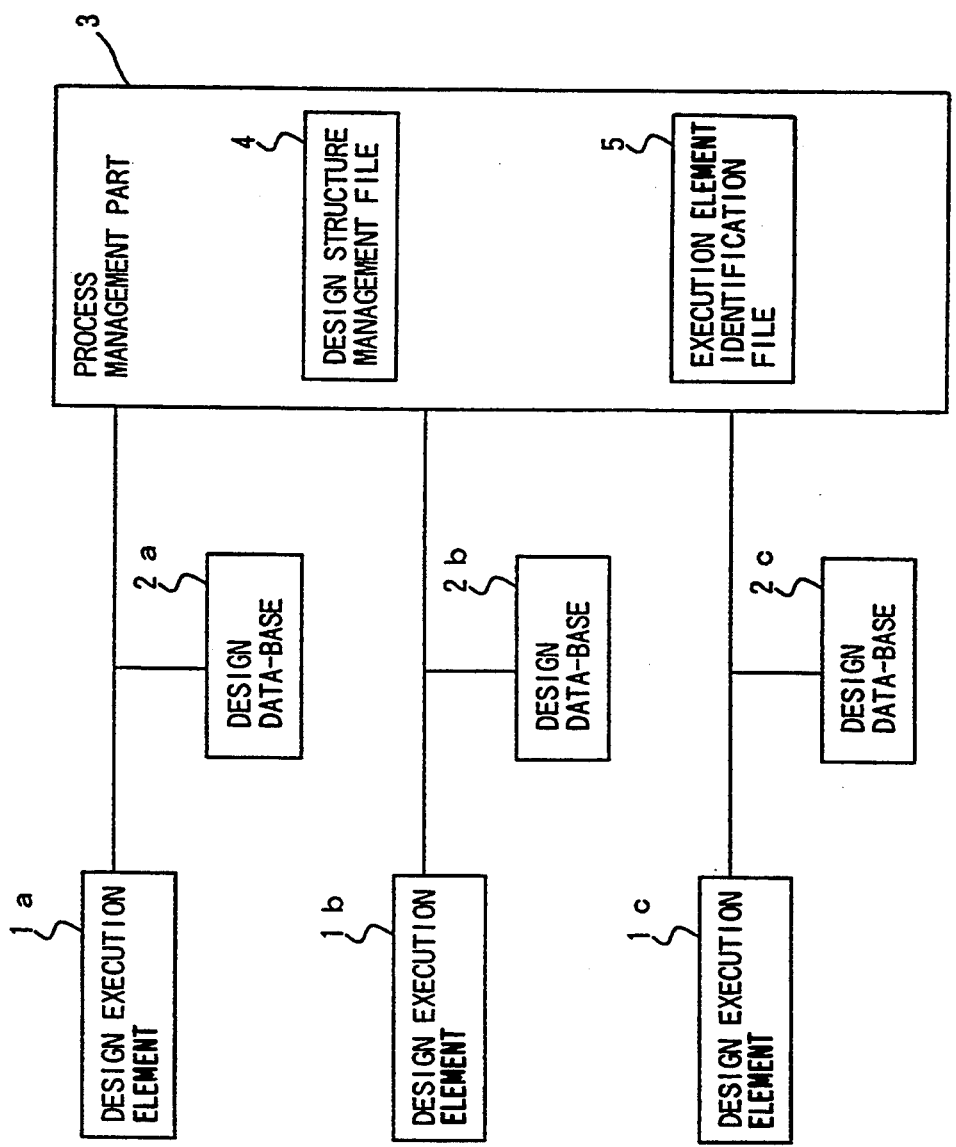
FIG. 1 is a block diagram illustrating the principle of the present invention.
Figure 2:
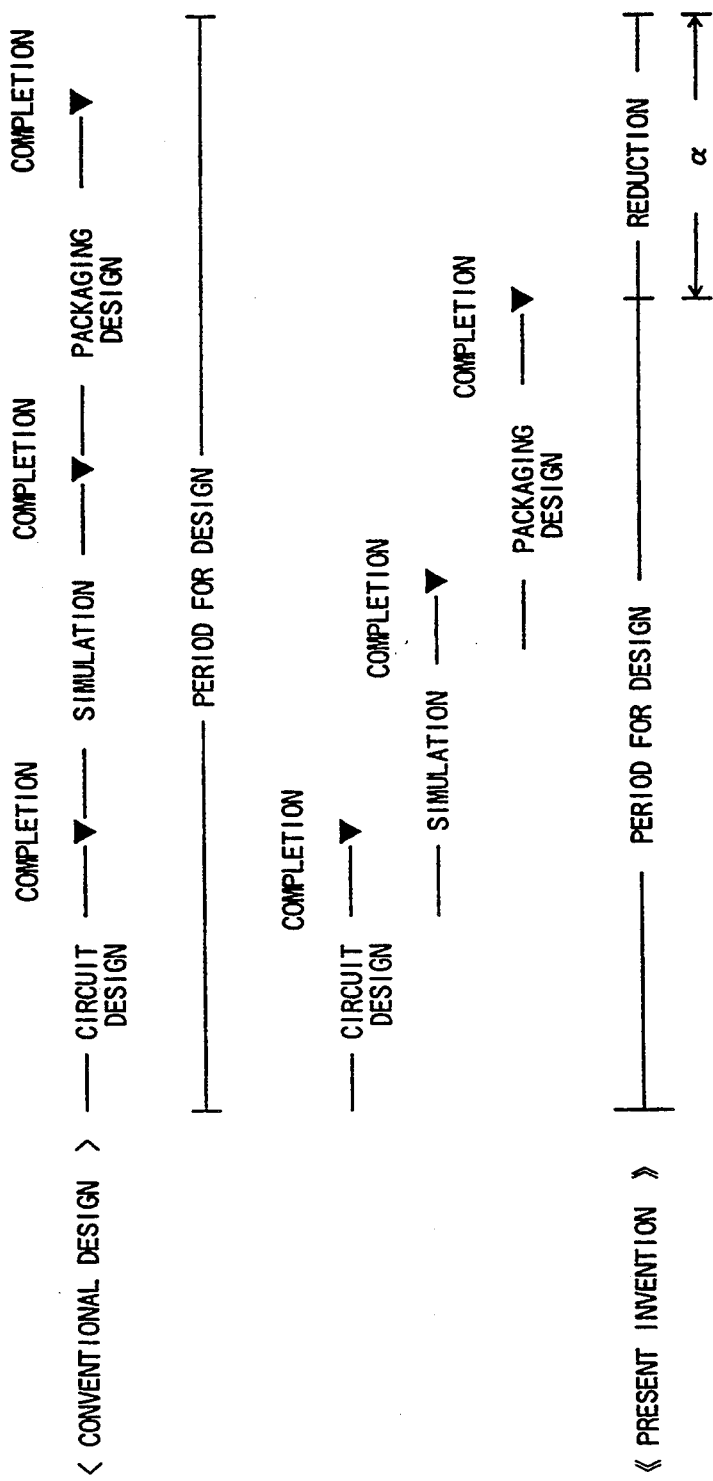
FIG. 2 schematically illustrates a time schedule in explaining the concept of reduction in time of the design process according to the invention.
Figure 3:
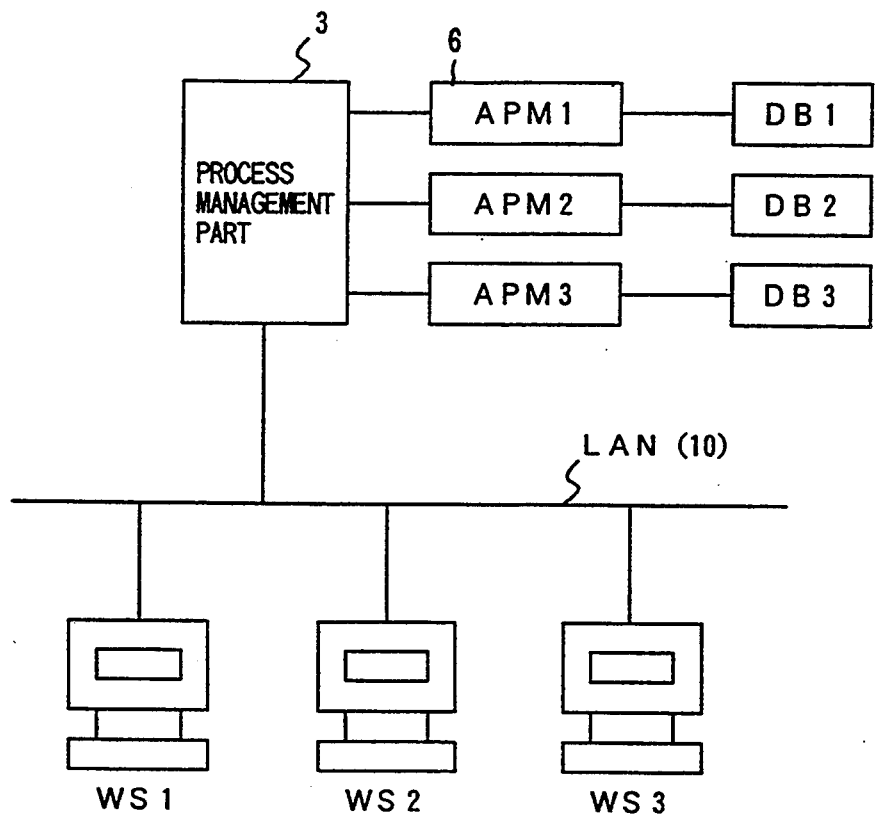
FIG. 3 is a block diagram of a modified structure of the invention.
Figure 5:
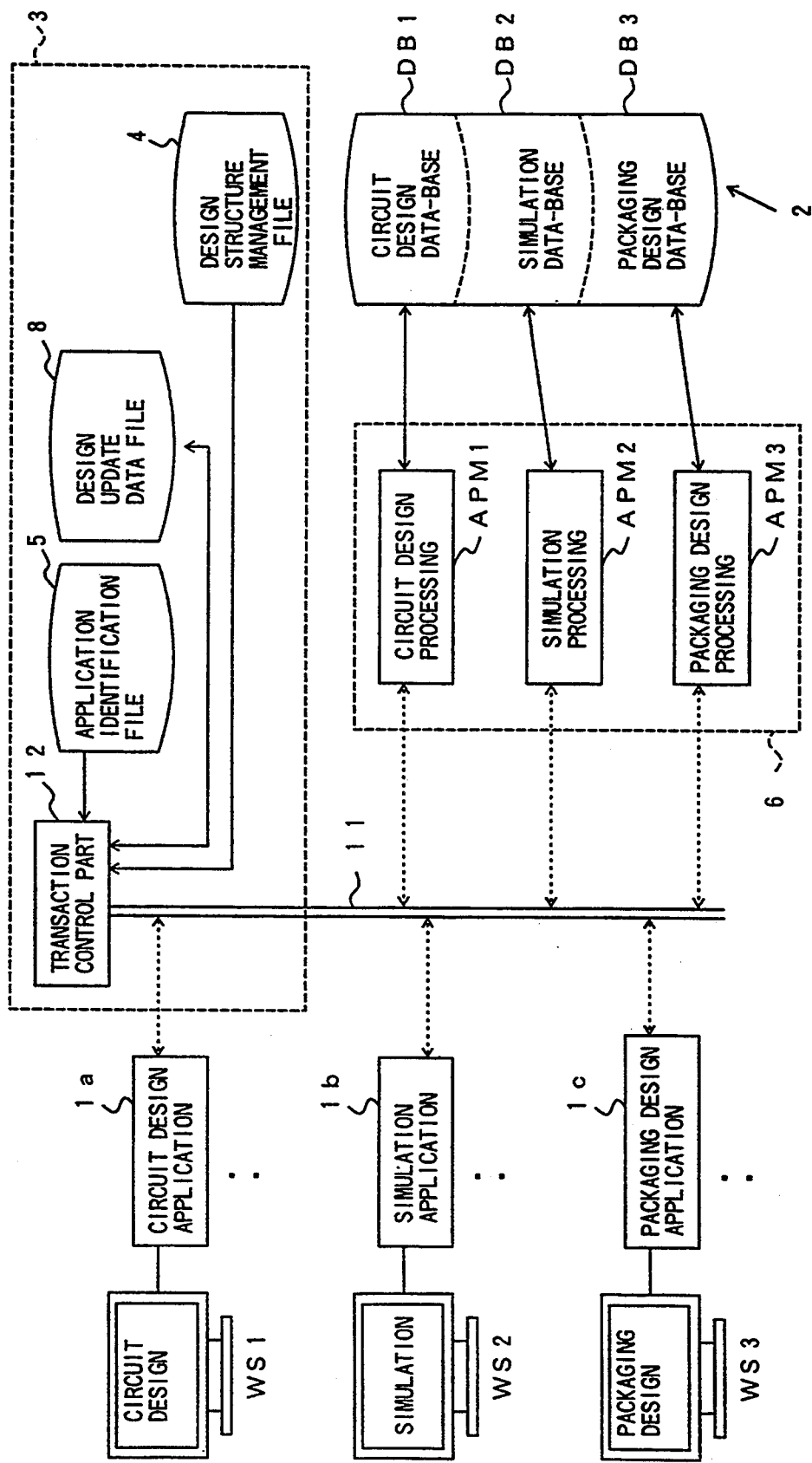
FIG. 5 is a block diagram illustrating the system structure of one embodiment of the computer aided design support device.

Referring to FIG. 5, there is shown a system structure of one embodiment of the computer aided design support device according to the invention. In this figure, a circuit design application, a simulation application and a packaging design application as design execution elements 1a, 1b, 1c are executed on workstations WS1-3 respectively, and are connected to a transaction bus 11. The transaction bus 11 may be a local area network or a data bus of a computer system which forms a transaction control part 12 as will be described later.

On the transaction bus 11, application processing device (execution processing device 6) comprising circuit design means APM1, simulation means APM2 and packaging design means APM3 is provided, and design data bases comprising circuit design data base 2 (DB1), simulation data base 2 (DB2) and packaging design data base 2(DB3) are connected to be under control of the application processing device 6.

The transaction bus 11 is managed by the transaction control part 12, which comprises a design structure management file 4 for managing interior structure of the design data bases, an application identification file 5 (execution device identification file 5) for identifying objects of linkage among the design applications, and a design update data file 8 for storing data updated among the design applications. These files are created in a memory of an information processing device which forms the function core of the transaction control part 12, or in any other storage device. The transaction control part 12 achieves control and linking of the design applications (the circuit design, simulation, and packaging design applications), and is always placed in operation to monitor the system. These transaction control part 12, design structure management file 4, application identification file 5 and design update file 8 substantially form the process management part 3.

Next, constructions and objects of (1) the design structure management file 4, (2) the application identification file 5, (3) design update file 8, and (4) the transaction control part 12 will now be explained in detail.

(1) Design Structure Management File

Figure 6:
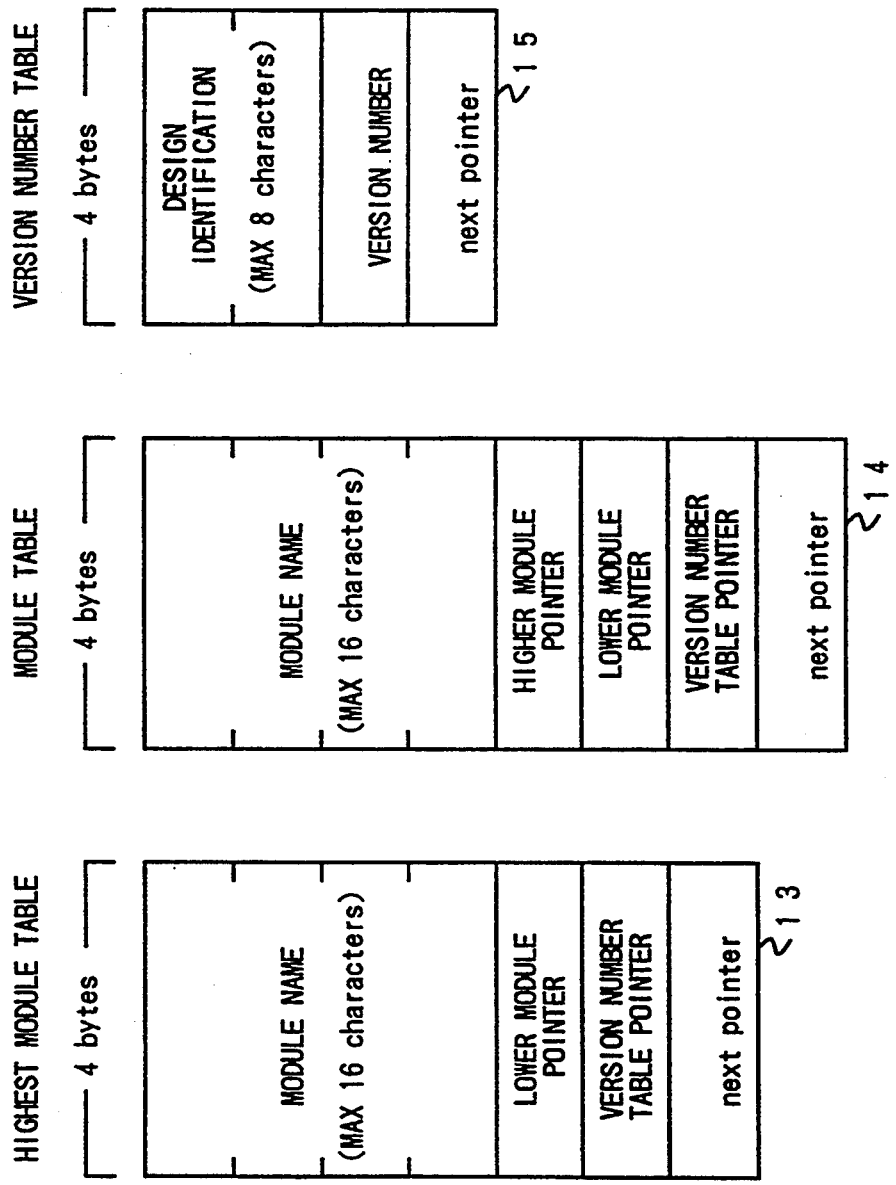
FIG. 6 illustrates the address assignment and the structure of a design structure management file.

The design structure management file 4 comprises, as shown in FIG. 6, three tables of a highest module table 13, a module table 14, and a version number table 15, and stores information for managing the hierarchical structure of objects of design and also version numbers at each stage of the design process.

The highest module table 13 is a table designed to register a module at the highest position in the hierarchical structure. In addition to module names, this table is to store lower order modules in the hierarchy, version number table 15 and pointer values for another module at the highest position.

The module table 14 is a table to register modules, other than those at the highest position, which form the hierarchical structure. This table is to store other modules at higher/lower positions than its particular module, version number table 15 and pointer values for the next module.

The version number table 15 is a table to register version numbers of data at each stage of the design process. This table is to store design identification for storing character strings to identify types of the object of design, version numbers and pointer values for the next module.

Figure 7:
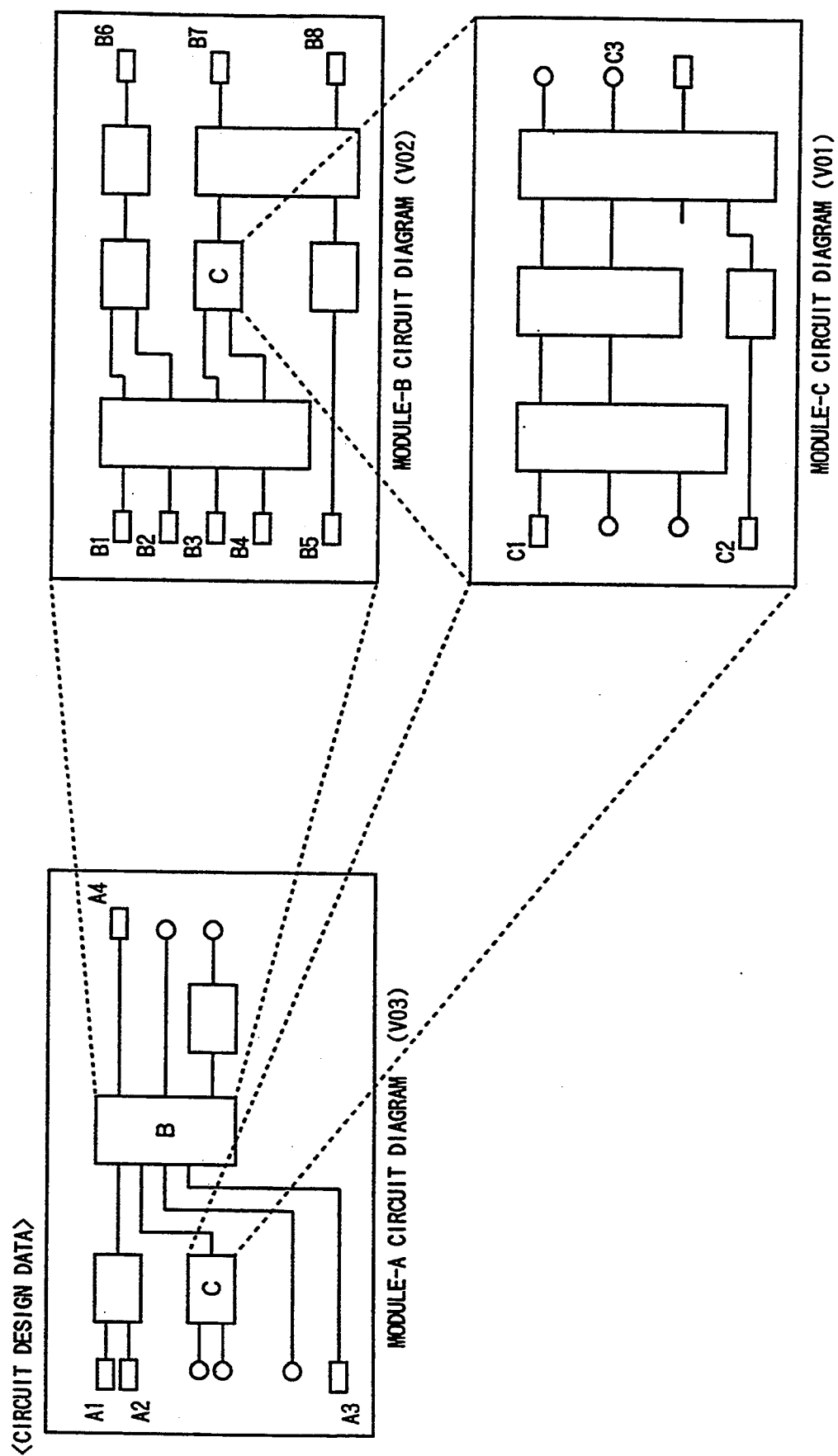
FIG. 7 is an explanatory diagram showing the hierarchical structure of circuit design data.

Next, the design structure management file 4 will be explained in detail below by way of examples. FIG. 7 shows a circuit design data for an electronic circuit which is stored in the circuit design data base 2. In this figure, the hierarchy is constructed such that a module A (version number 03) includes a module B (version number 02) and a module C (version number 01), and the module B (version number 02) includes the module C (version number 01).

Figure 8:
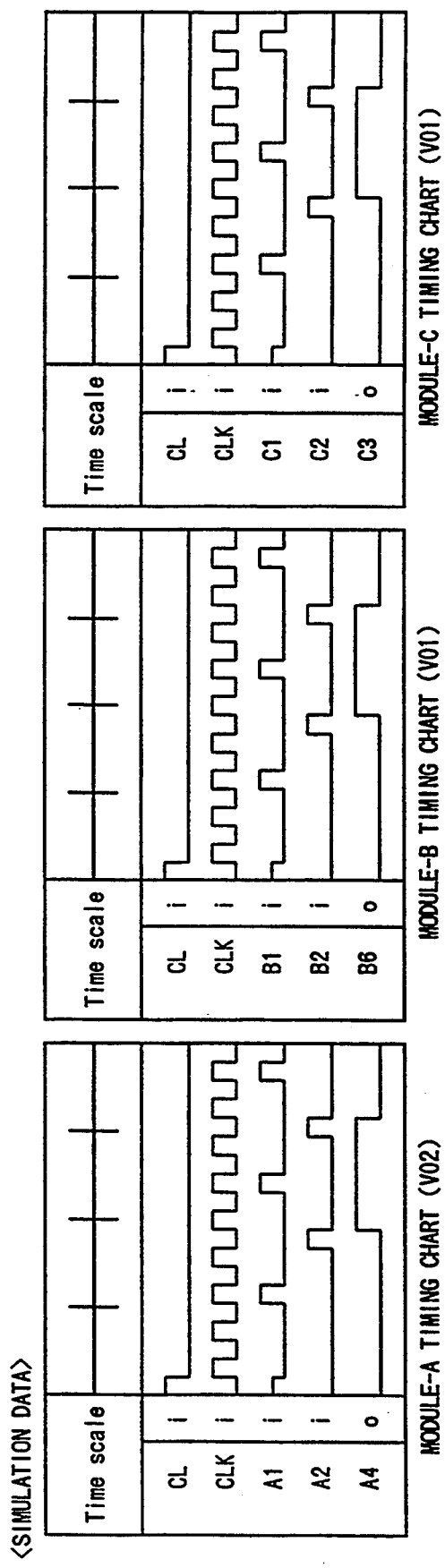
FIG. 8 is an explanatory diagram showing the hierarchical structure of simulation data.

In FIG. 8, there is shown a simulation data corresponding to the circuit design data in FIG. 7. In this figure, a timing chart of input/output signals of the module A (version number 02), a timing chart of input/output signals of the module B (version number 01), and a timing chart of input/output signals of the module C (version number 01) are shown corresponding to FIG. 7. This data is recorded in the simulation data base.

Figure 9:
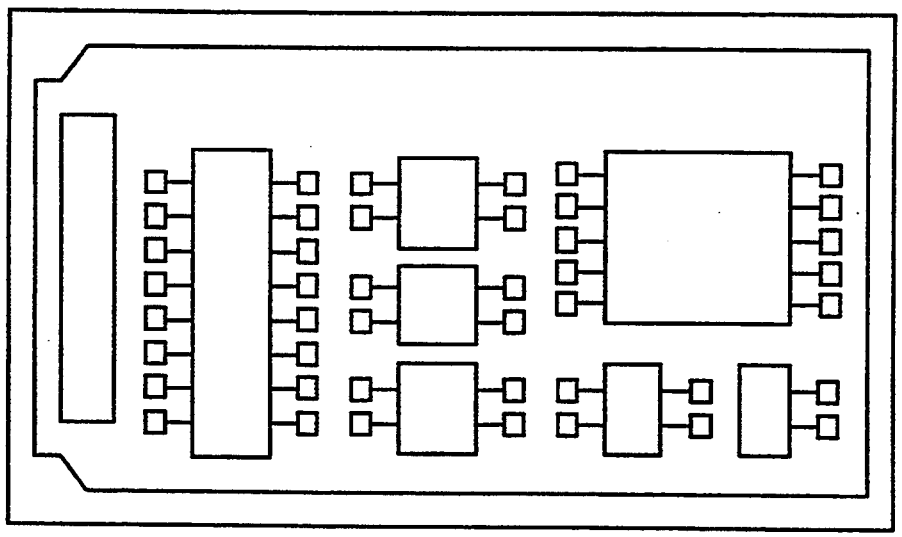
FIG. 9 illustrates one example of packaging design data.
Figure 10:
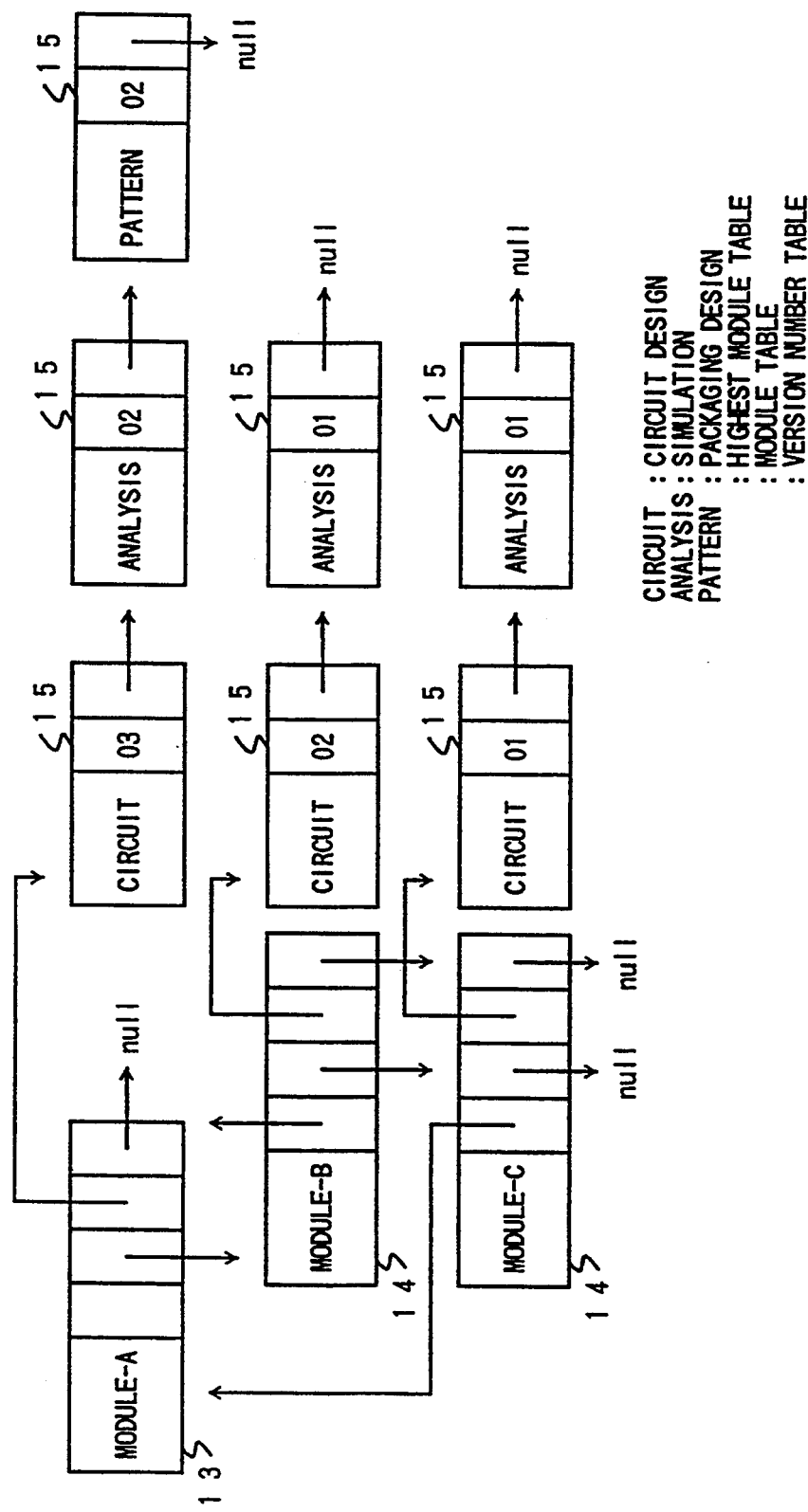
FIG. 10 schematically illustrates the hierarchical structure of a design structure management file.

FIG. 10 conceptually illustrates the actual management by the design structure management file 4 in use of the data as shown in FIGS. 7-9. In this embodiment, as explained in connection with FIG. 7, the module A is a module at the highest position, and the module B and the module C exist as lower modules thereof.

The module A is recorded in the highest module table 13 of FIG. 6 because it is at the highest position as shown in FIG. 7. The modules B and C are recorded in the ordinary module table 14, because they are lower modules.

In the table of the module A, a pointer value of the module B is recorded to the "lower module pointer", and a pointer value of the version number table 15 (CIRCUIT) of the circuit design data is recorded to the "version number table 15 pointer". And to the "next pointer", a null code is recorded in order to indicate that the next pointer does not exist because said module A is independent and at the highest position.

In the version number table 15 (CIRCUIT) which is designated by the version number table 15 pointer of the table of the module A, its version number (in this embodiment, 03) and a pointer value of the version number table 15 (ANALYSIS) of the next simulation data are recorded.

In the version number table 15 (ANALYSIS) of the simulation data designated by the version number table 15 of said circuit design data, its version number (in this embodiment, 02) and a pointer value of the version number table 15 (PATTERN) of the next packaging design data.

In the version number table 15 (PATTERN) of the packaging design data designated by the version number table 15 (ANALYSIS) of said simulation data, its version number (in this embodiment, 02) is recorded. Also, since this version number table 15 (PATTERN) is a final table, a null code indicating that no more pointers exist is recorded to the "next pointer".

In the module table 14 (MODULE-B) of the module B, a pointer value indicating the table of the module A is recorded to the "higher module pointer", and a pointer value indicating the table of the module B is recorded to the "lower module pointer". Also, a pointer value of the version number table 15 (CIRCUIT) of the circuit design table data is recorded to the "version number table 15 pointer". Further, a pointer value indicating the module table 14 of the next module C (MODULE-C) is recorded to the "next pointer".

In the version number table 15 (CIRCUIT) of the circuit design data designated by the version number table 15 pointer of the table of the module B, its version number (in this embodiment, 02) and a pointer value of the version number table 15 (ANALYSIS) of the next simulation data are recorded.

In the version number table 15 (ANALYSIS) of the simulation data designated by the version number table 15 (CIRCUIT) of said circuit design data, its version number (in this embodiment, 01) is recorded. Since the version number table 15 of the packaging design data is recorded as the version number table 15 (PATTERN) which is under control of the module A as mentioned in the above, a null code indicating that the next pointer does not exist is recorded to the "next pointer" in the version number table 15 (ANALYSIS) of the simulation data.

In the module table 14 (MODULE-B) of the module C, a pointer value indicating the table of the module A is recorded to the "higher module pointer". Since the module C is the lowest module, a null code indicating no lower modules exist is recorded to the "lower module pointer". A pointer value of the version number table 15 (CIRCUIT) of the circuit design data is recorded to the "version number table 15 pointer". And, a null code indicating that the next pointer does not exist is also recorded to the "next pointer".

In the version number table 15 (CIRCUIT) of the circuit design data designated by the version number table 15 pointer of the table of the module C, its version number (in this embodiment, 01) and a pointer value of the version number table 15 (ANALYSIS) of the next simulation data are recorded.

In the version number table 15 (ANALYSIS) of the simulation data designated by the version number table 15 (CIRCUIT) of said circuit design data, its version number (in this embodiment, 01) is recorded. Since the version number table 15 of the packaging design data is recorded as the version number table 15 (PATTERN) which is under control of the module A as mentioned in the above, a null code indicating that the next pointer does not exist is recorded to the "next pointer" in the version number table 15 (ANALYSIS) of the simulation data.

Retrieving the design structure management file 4 as described in the above makes it possible to identify objects to be linked among the applications. For example, it is seen that the circuit design step of the module A with version number 03 is to be linked with the simulation step of version number 02 and the packaging design step of version number 02. Since the module B and the module C have a hierarchical relationship with each other in the same circuit design step, it is also seen that the circuit design step of the module C with version number 01 is to be linked with the circuit design step of the module B with version number 02 and the circuit design step of the module A with version number 03.

Actual data linkage based on the design structure management file 4 will be explained later.

(2) Application Identification File

After the objects of linkage have been identified by the design structure management file 4 as mentioned in the above, the application identification file 5 is employed in transferring among the applications for the purpose of identifying a direction of the data transfer.

Figure 11:
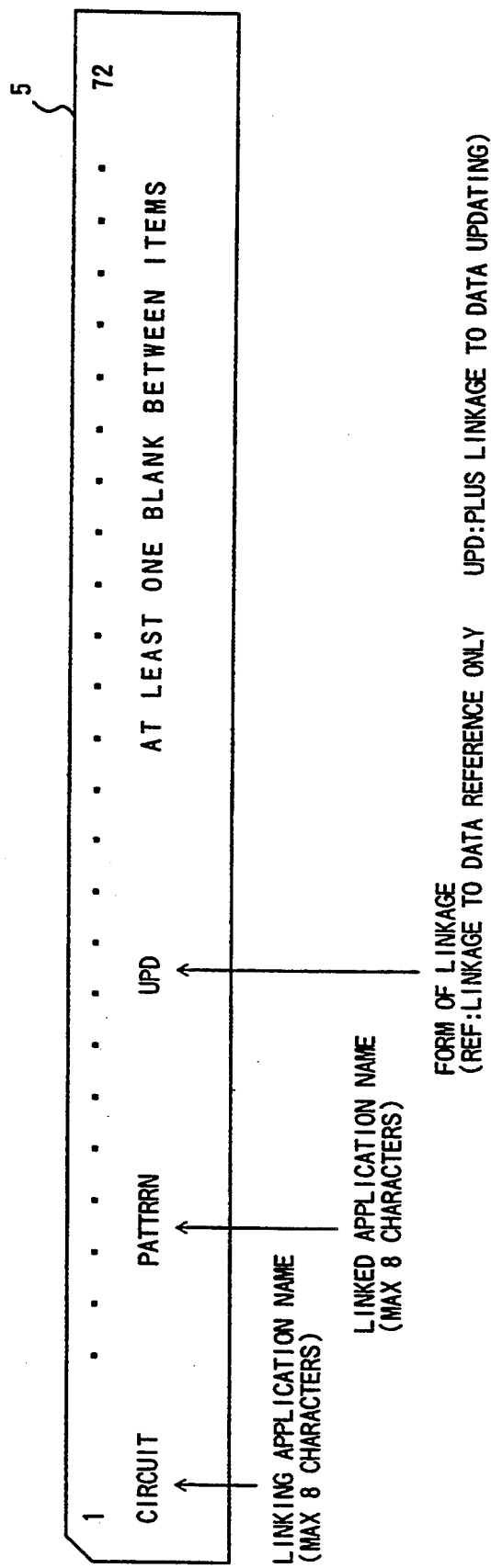
FIG. 11 shows the content of an application identification file.

This file sets up data in the form of control statement as shown in FIG. 11 according to the design environment. In this figure, a "linking application name" (CIRCUIT: circuit design step), a "linked application name" (PATTERN: packaging design step) and a "linkage form" (UPD: linkage with updating of data) are recorded in the form of contiguous commands. In addition to the mode of linkage with updating of data (UPD), there is also provided another mode of linkage (REF) in which only reference to data is made without updating of data.

(3) Design Update Data File

In case of data transfer between the applications, the design update data file 8 is used to temporarily file data being transferred from the linking application if the linked application is not activated. This file name is set up in the form of, for example, "design identification name; module name; version number", in which an instruction method that enables identification of transferred (linked) applications is employed.

Data is once filed in the design update data file 8 and, when the linked application is activated, is output from the data file 8, so that the data from the linking application is reflected to the activated linked application.

As this design update data file 8 being created, linkages between the applications can be established disregarding the state of operation of the linked applications. This is particularly advantageous to such a system that a circuit design step, a simulation step and a packaging design step are separated and distributed, and also are connected to each other by a network.

If the linked application has been already activated, then there is no need to create the design update data file 8. In this case, however, the data file 8 may be used as a backup file to store data.

(4) Transaction Control Part

Figure 12:
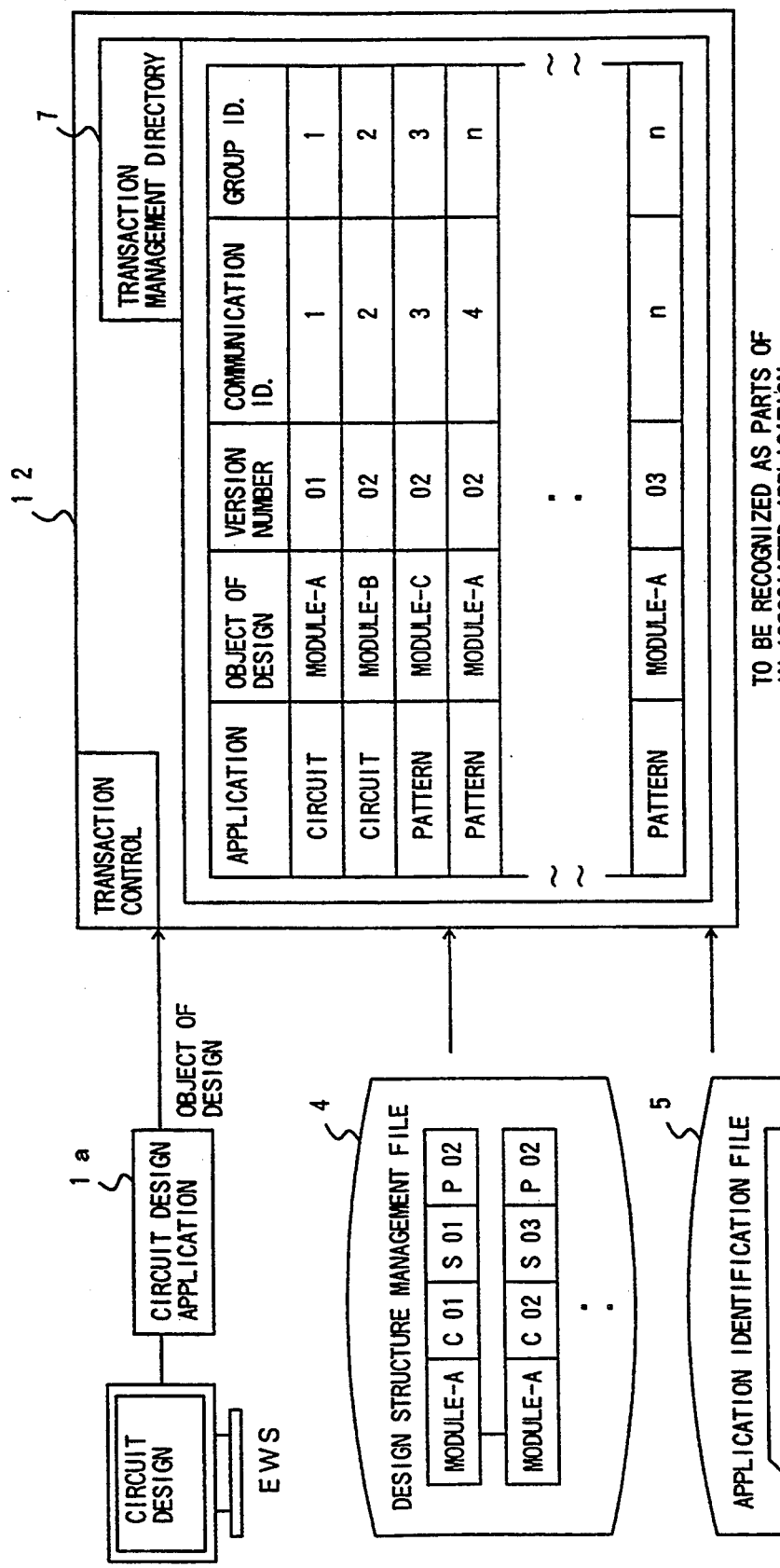
FIG. 12 shows the content of a transaction management directory.

The transaction control part is provided with a transaction management directory 7. This transaction management directory 7 is designed to record "application names", "names of objects of design", "version numbers", "communication IDs", and "group IDs" in the form of table as shown in FIG. 12. As "application names", "CIRCUIT" for the circuit design step, "ANALYSIS" for the simulation step and "PATTERN" for the packaging design step are recorded respectively. To the "objects of design", module names such as "MODULE-A", "MODULE-B" are recorded, and version numbers for each module are recorded to the "version number" as described in the above.

The "communication ID" is a sign or code to identify communications between processes, and a specific identifier is assigned to it. The "group ID" is to indicate relationship of linkage among the applications, and the same identifier is assigned to a group of applications bearing the same relationship with each other.

Next, a procedure to identify the associated applications in use of the transaction management directory 7 will be explained briefly below.

First, names of object of design to be processed, application names and version numbers are posted from the design applications to the transaction control part 12. The transaction control part 12 records the posted information into the transaction management directory 7.

Next, the transaction control part 12 retrieves the design structure management file 4 on the basis of the recorded objects of design and its version numbers so as to find associated objects of design and its version numbers. Further, the transaction control part 12 examines on the basis of the results of said retrieval whether any associated object of design (module) exists in the transaction management directory 7 or not, and if it exists, sets up the same group ID.

Finally, the transaction control part 12 finds out design applications having the same group ID from the transaction management directory 7, and at the same time reads out the application identification file 5 so as to determine a direction of transfer, and performs data transfer between the design applications being linked with each other.

In FIG. 12, the application name (CIRCUIT), the object of design (MODULE-A) and the design version number (01) from the circuit design application are recorded in the transaction management directory 7, and version number of the circuit design data linked with module A, version number of the simulation data and version number of the packaging design data are read out from the design structure management file 4, so that with respect to the module A, it is recognized that the circuit design application of version number 01 and the packaging design application of version number 02 are linked with each other, and the same group ID "1" is assigned to them.

Figure 13:
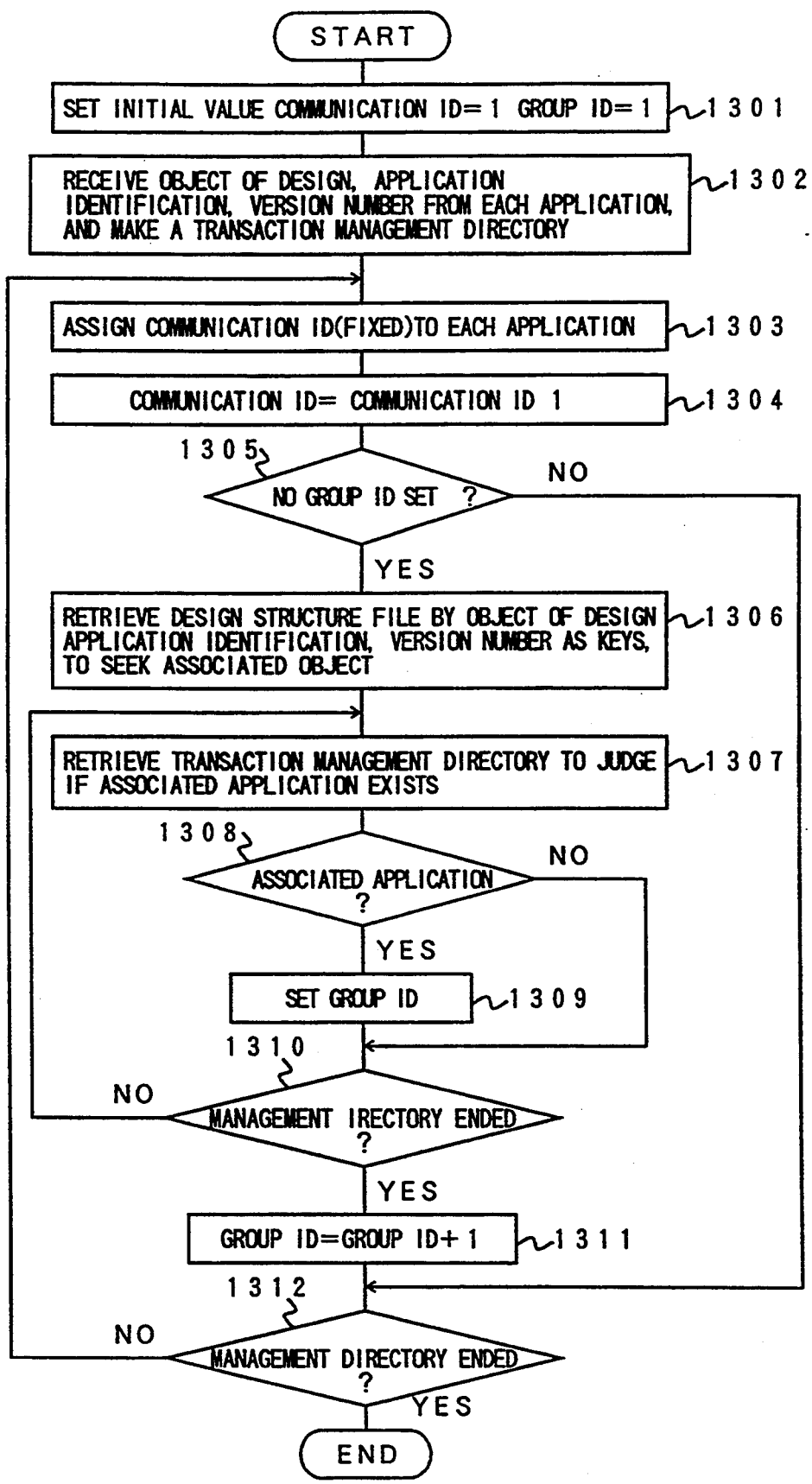
FIG. 13 is a flow diagram illustrating the process of giving communication IDs and group IDs at transaction control part.

The above proceedings are represented in the form of procedure steps of the transaction control part 12 in the flow diagram of FIG. 13. The transaction control part 12 first sets both the "communication ID" and the "group ID" to "1" at the initial activation (step 1301).

Next, it receives names of design objectives, application identifications and version numbers posted from the applications, and the transaction management directory 7 is established (step 1302). And specific communication IDs are assigned to each of the applications (step 1303). Since the initial value of the communication ID is "1", the communication ID of the design application which is first recognized becomes "1". And, "1" is added to the communication ID (step 1304). As a result, each of the design applications is given a specific communication ID incremented by "1" for each application.

Next, whether the "group ID" is provided or not is judged (step 1305). Here, since no "group ID" is recorded in the transaction control part 12 at the initial activation, it branches to the positive logic (yes). Setup of the group ID is commenced by retrieving the design structure management file 4 relying upon the objects of design, application identifications and version numbers so as to seek each object of linkage (step 1306). Further, the transaction management directory 7 is retrieved to judge whether an associated design application exists on the transaction management directory 7 or not (step 1307). If an associated application is found on the transaction management directory 7 (step 1308), these associated applications are set to the same group ID (at the initial activation, "1"). Here, if the final data of the management directory is loaded (end of the management directory), the "1" is added to the group ID.

In the step 1305, if the group ID has been already set up, loading of the final data of the management directory is confirmed (step 1312) before the process is ended.

Figure 14:
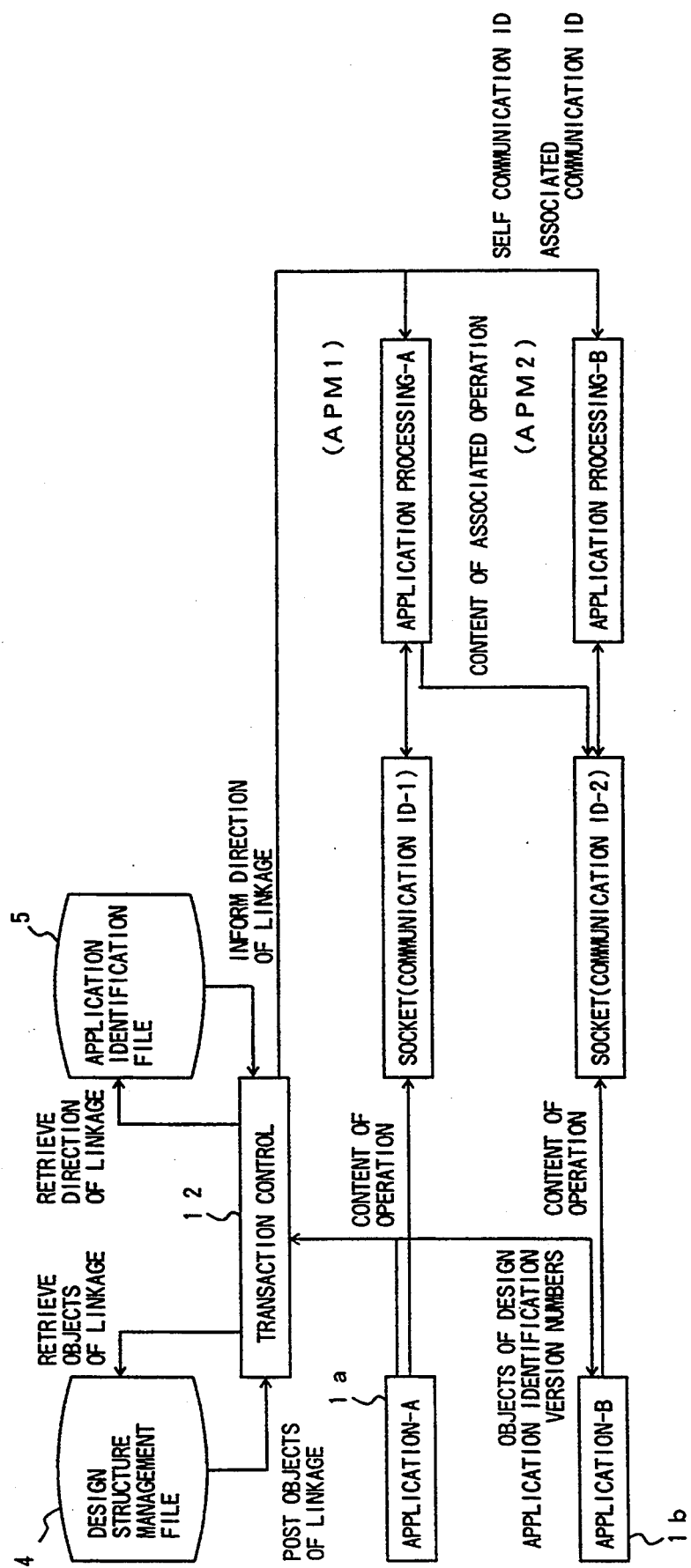
FIG. 14 illustrates the concept of a method of data transfer among associated applications when a linked application is running.

Next, a method of data transfer among the associated applications will be explained below. FIG. 14 conceptually illustrates a process of linkage in which processing in the application-B (for example, the simulation step) is affected by processing (modification of data) in the application-A (for example, the circuit design step). In this figure, both the applications A, B are shown being placed into execution.

Also in this figure, SOCKET (communication ID-1, communication ID-2) device, for example, an UNIX system-distributed inter-process communication application. In such an inter-process communication application, data communication between processes is performed through a kind of file called "socket".

In FIG. 14, names of objects of design, application identifications and version numbers are posted from the activated applications-A and B to the transaction control part 12.

The transaction 12 can access the design structure management file 4 to retrieve objects of linkage, and also can access the application identification file 5 to retrieve directions of linkage. Thus, the transaction control part 12 retrieves group IDs in the transaction management directory 7 so as to find the same IDs and identify applications being associated with each other beforehand. In FIG. 14, the same group ID is assigned to the application A and the application B, and data is linked from the application A to the application B.

And the transaction control part 12 posts each application processing device 6 (A, B) the communication ID of its associated applications and the operating states of the applications. In the example of FIG. 14, "communication ID-1" as a self-communication ID and "communication ID-2" as an associated communication ID are posted to the application processing device A, And, "communication ID-2" as a self-communication ID and "communication ID-1" as an associated communication ID are posted to the application processing means B.

Next, the application processing device A or B analyzes through the socket (communication ID-1, 2) contents of operations of the corresponding design application (A or B), and judges whether it will affect the succeeding design step or not.

In the example of FIG. 14 where the contents of operations of the application-A affect the operations of the application-B to be carried out in the next design step, the application processing device A posts the application processing device B the contents of operations being associated with the application-B through the socket (COMMUNICATION ID-2). Hence, the application processing device B updates its data base (for example, the simulation data base).

Figure 15:
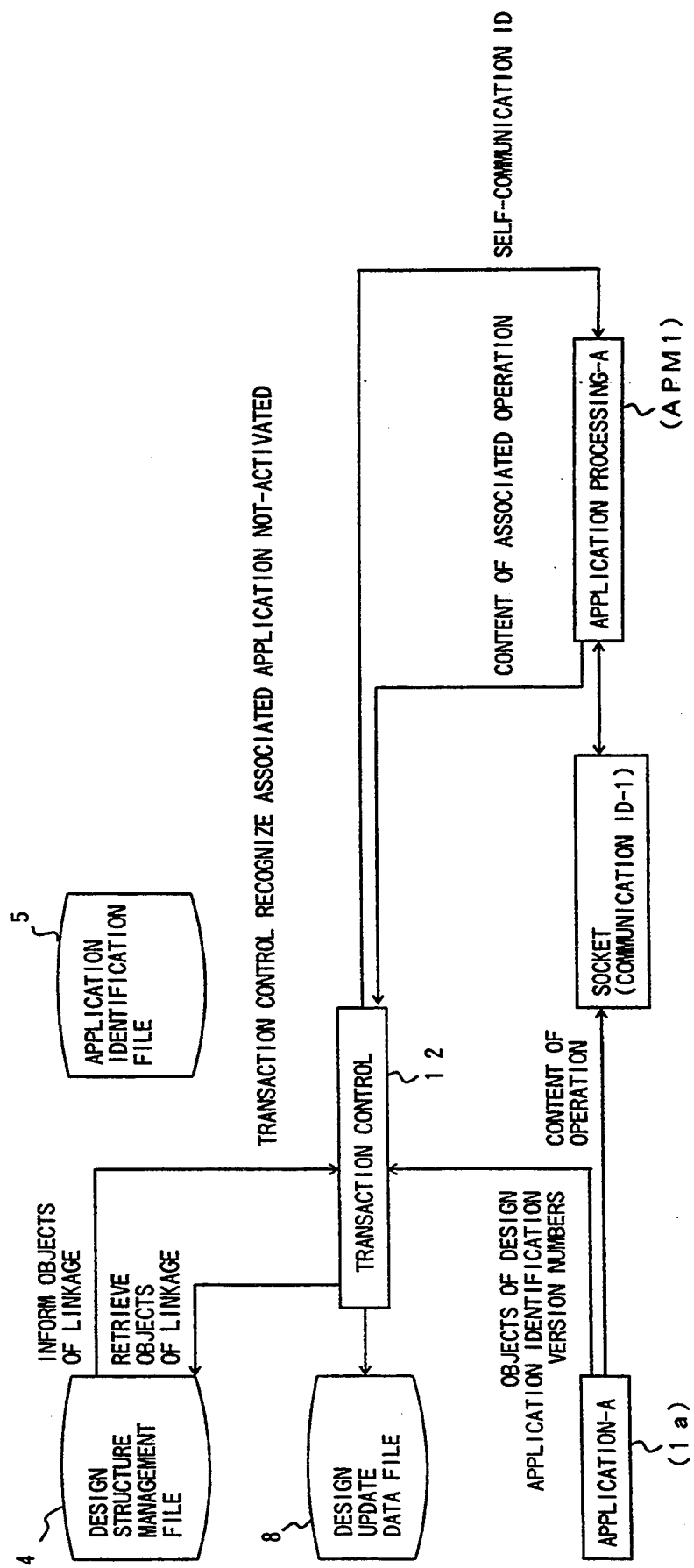
FIG. 15 illustrates the same with FIG. 14 but when the linked application is not running.

While the above description refers to the case where both the linking application A and the linked application B have been activated, the present invention is also applicable to a case where applications can be activated at each workstation on a network and each process are carried out separately. Then, even if operations performed by the linking application A (for example, the circuit design step) may affect the next step or the application B (for example, the simulation step), it may occur that the application B has not been activated at that moment. FIG. 15 conceptually illustrates data transfer performed under the condition that a linked application (for example, B) has not been activated.

In this figure, the names of objects of design, the application identifications and the version numbers etc. are posted to the transaction control part 12 from the application-A that has been already activated.

The transaction control part 12 may access the design structure management file 4 to retrieve the objects of linkage. Thus, the transaction control part 12 retrieves group IDs in the transaction management directory 7 to find the same IDs, so that it may identify the applications being associated with each other beforehand, and also it may see whether the associated applications have been activated or not. Here, while the same group ID is assigned to the application A and the application B, it is understood that the application B has not been activated yet.

And the transaction control part 12 posts the application processing device A its communication ID (COMMUNICATION ID-1) and the fact that the associated application B has not been activated.

Next, the application processing device A analyzes through the socket (communication ID-1) the contents of operations of the design application A, and judges if it will affect the succeeding design step (the application B in a state of non-activation) or not.

In the example of FIG. 15 where the contents of operations of the application-A will affect the operations of the next design step or the application-B, the application processing device A posts the transaction control part 12 the contents of operations being associated with the application-B. Hence, the transaction control part 12 stores the contents of operations of the application-A (data of linkage) into the design update data file 8.

Figure 16:
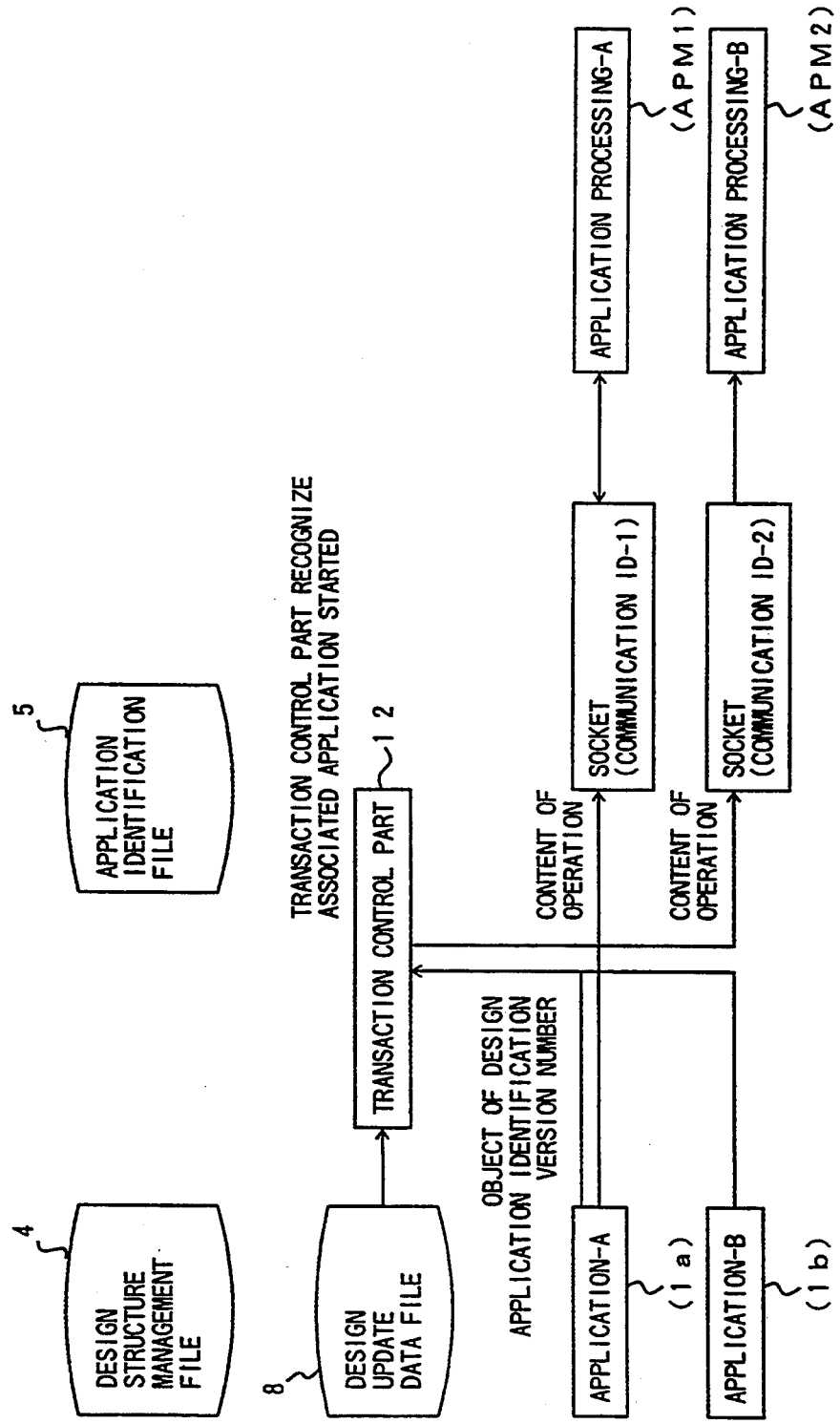
FIG. 16 illustrates the same with FIG. 14 but when the linked application of linkage is activated.

The transaction control part 12 continuously monitors the states of operation of the applications, and when the linked application B is activated, starts to perform the processes as shown in FIG. 16. More particularly, if it is recognized that the application B is activated, the transaction control part 12 reads out the data of linkage stored in the design update data file 8 and posts it through the socket (COMMUNICATION ID-2) to the application processing device B. Hence, the application processing device B updates its data base (for example, the simulation data base).

Figure 17:
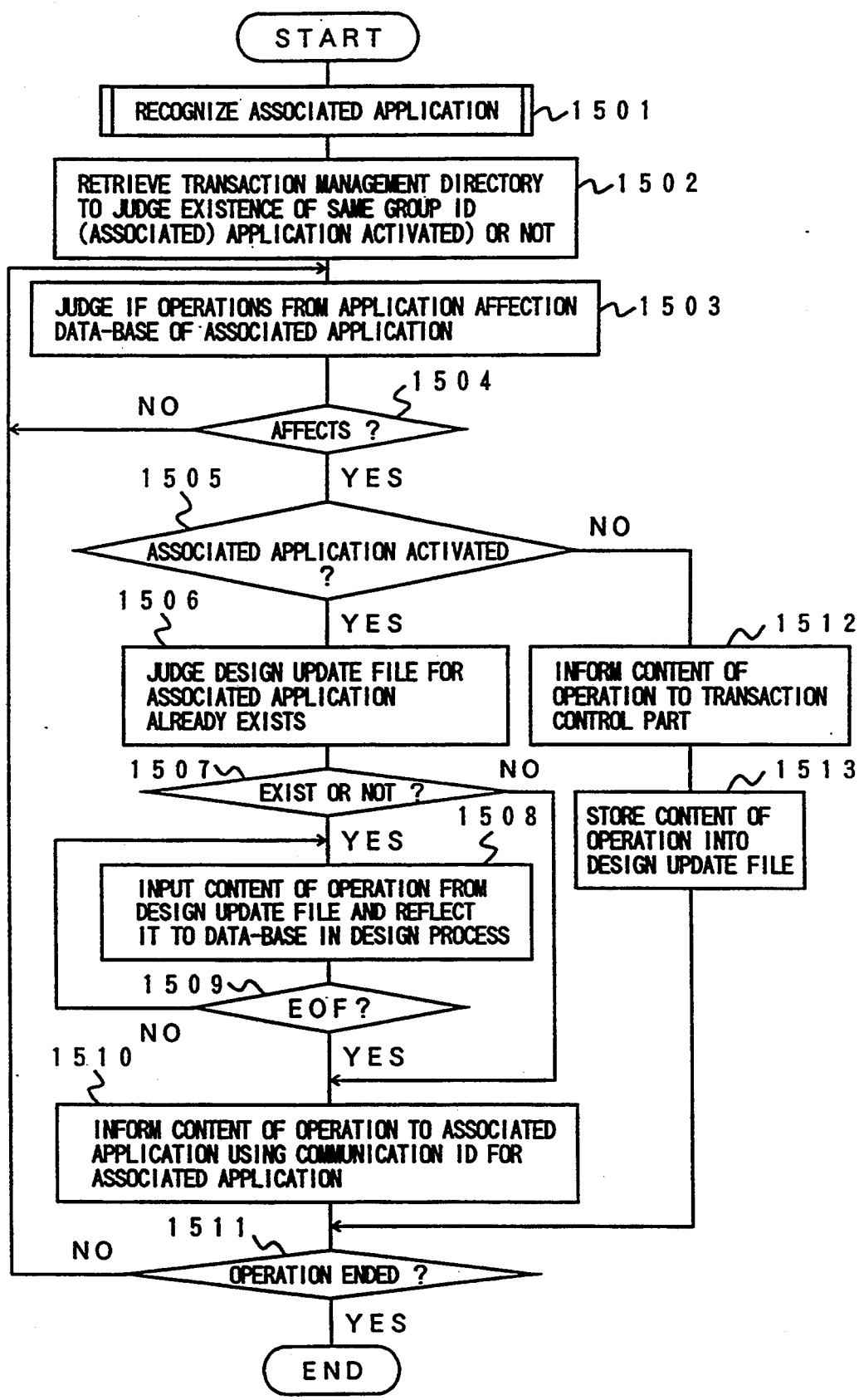
FIG. 17 is a flow diagram illustrating the process of data transfer among the associated applications.
Figure 18:
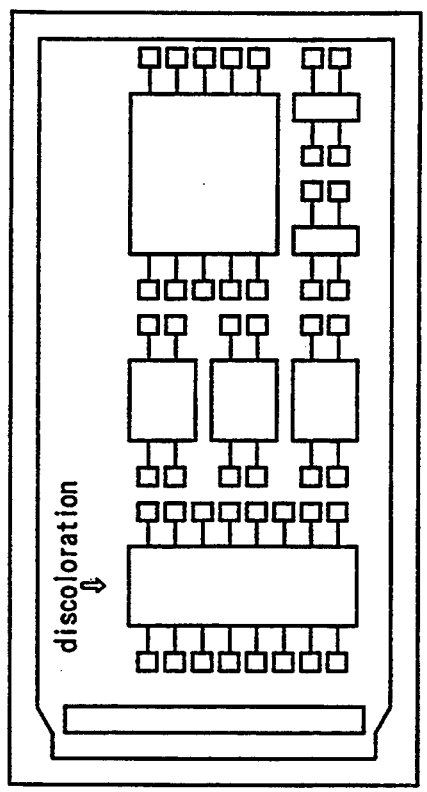
FIG. 18, FIG. 19 and FIG. 20 illustrate examples of reflection of a modification to data between the different design steps respectively.
Figure 18:
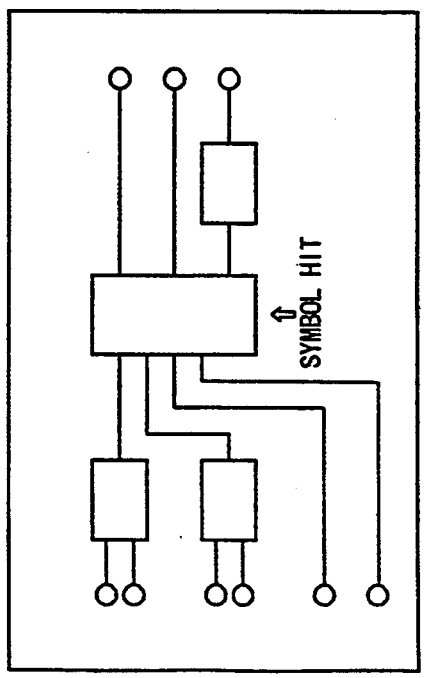
Figure 19:
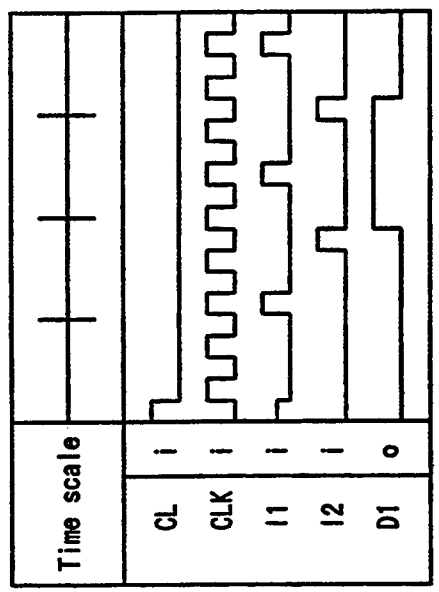
Figure 19:
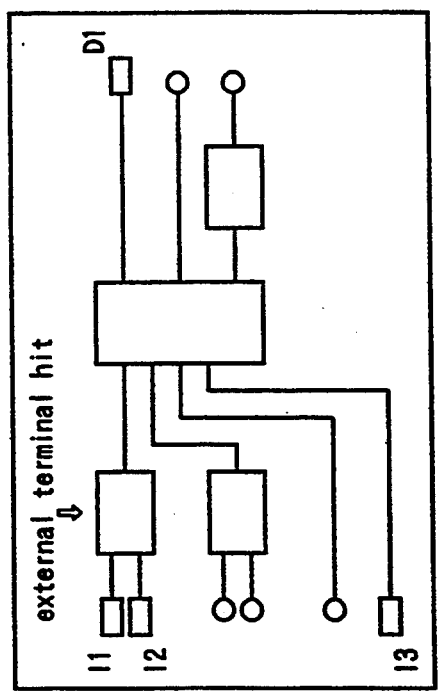
Figure 20:
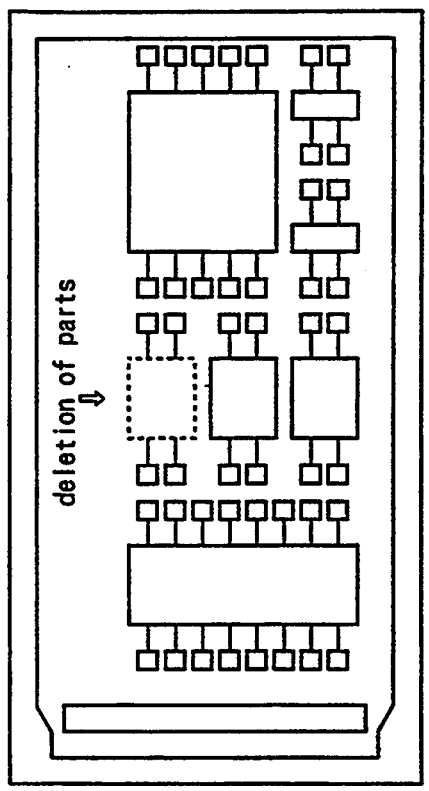
Figure 20:
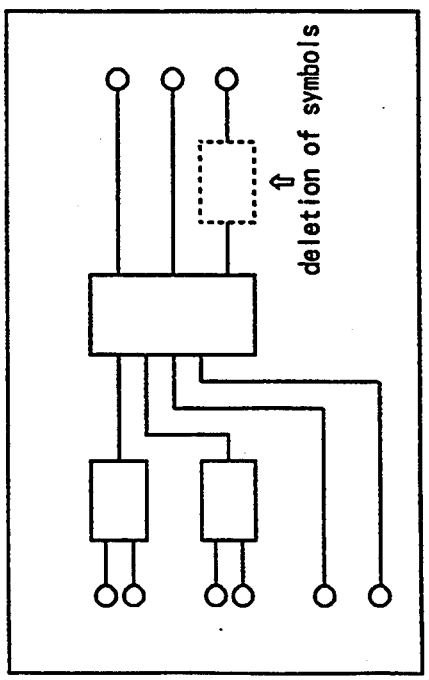

FIG. 17 is a flow diagram illustrating the series of proceedings as described in the above in conjunction With FIGS. 14–16. Referring to this figure, again the process to be carried out by said transaction control part will be summarized and explained below.

The transaction control part 12 first recognizes the associated applications (in this embodiment, A and B) (step 1501), and accesses the transaction management directory 7 to judge whether the same group ID exists or not (the associated application has been activated or not) (step 1502).

Next, the application processing device (in this embodiment, A) judges if operations of one of the applications (in this embodiment, A) affect the data base of its associated application (in this embodiment, B) (step 1503). If it does, i.e. if the contents of the operations at the application A affect the data base of the next application B, then whether its associated application B has been activated or not is judged (steps 1504 and 1505).

Next, whether the design update data file 8 for said associated application B has been already created or not is judged (step 1506). If both the linking application and the linked application have been activated at the establishment of the linkage, the design update data file 8 has not been created yet and inter-application communication is available. Then, the contents of the operations of the application A are posted to the associated application B and the application processing device B by means of the socket for the associated application (COMMUNICATION ID-2) (steps 1507, 1510, 1511).

At step 1505, if the associated application B has not been activated, the application processing part A posts the contents of the operations (the data of linkage) of the relevant application A to the transaction control part 12 (step 1512). Then said transaction control part stores the posted contents of the operations into the design update data file 8 (step 1513).

At step 1507, if the design update data file 8 for the associated application B has been already created, the contents of the operations of the linking application A is read out from the design update data file 8 and posted to the application processing device B to update the data base being managed by the application processing part B (step 1508). And this procedure is repeated until it reaches the final data of the file (step 1509).

What is claimed is:

1. A computer aided design support device, comprising:

at least first, second and third design execution means each being executed independently of each other, and each being placed into execution step by step keeping a certain time difference therebetween;

a group of design data bases comprising a first, a second and a third design data base each being called by each of said first, second and third design execution means, respectively; and a process management part, connected to said first, second and third design execution means and said group of design data bases, to manage an entire process implemented by the computer aided design support device, said process management part including a design structure management file which manages a hierarchical structure of objects of design and version numbers, and, when a modification is made to design contents of said objects of design in one of said design execution means said design structure management file updates a linking operation by specifying the modification to a part or parts of the objects of design in another one of said design execution means, and said process management part further including an execution element identification file which specifies a direction of transfer in data transferring being performed between the design execution means.

2. The computer aided design support device as set forth in claim 1, wherein each said design data base has a processing part to perform data processing of the design data bases corresponding to the design execution means, and wherein said design execution means and the processing parts are connected with each other by means of communication lines.

3. The computer aided design support device as set forth in claim 1, wherein said process management part further includes a transaction management file which is created on receipt of names of the objects of design and the version numbers at each stage in the hierarchical structure management process which are posted from the design execution means and, the process management part retrieves said design structure management file based on the transaction management file to specify the associated objects of design and version numbers.

4. The computer aided design support device as set forth in claim 1, wherein said process management part further includes a design update data file for storing data from said one design execution means when the modification of design is made to said another design execution means and when said another design execution means is not placed into execution.

5. The computer aided design support device as set forth in claim 1, wherein said process management part monitors whether the design execution means are activated or not, and posts the data from said one design execution means being stored in said design update data file to the another design execution means or to the processing part if activation of said another design execution means are recognized.

6. A computer aided design support device, comprising:

a circuit design device to execute a circuit design application;

a simulation device to execute a simulation application;

a packaging design device to execute a packaging design application;

an execution processing means, connected to said circuit design device, said simulation device, and said packaging design device via a transaction bus, for accessing databases including a circuit design database, a simulation database and a packaging design database; and a process management part including a design structure management file which manages a hierarchical structure of objects of design and version numbers, and, when a modification is made to design contents of said objects of design in one of said applications, said design structure management file updates a linking of the applications by specifying the modification to a part or parts of the objects of design in another one of said applications, and said process management part further including an execution element identification file which specifies a direction of data transfer being performed between said applications.

7. A process management device for a computer aided design support system comprising:

a design structure management file to manage design applications and including a highest module table, a module table and a version number table, each said table storing information for managing the hierarchical structure of objects of design and also version numbers at each stage of a design process;

an application identification file to transfer identification data among the design applications and to identify a direction of data transfer among the design applications;

a design update data file to temporarily file data being transferred from a linking application if the linking application is not activated; and a transaction control device, including a transaction management director, to control and link the design applications.

* * * * *